US006569548B2

(12) United States Patent
Yamamoto et al.

(10) Patent No.: US 6,569,548 B2
(45) Date of Patent: May 27, 2003

(54) TRANSPARENT CONDUCTIVE FILM OF ZINC OXIDE

(75) Inventors: Tetsuya Yamamoto, Kochi (JP); Ken Nakahara, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/920,292

(22) Filed: Aug. 2, 2001

(65) Prior Publication Data

US 2002/0025440 A1 Feb. 28, 2002

(30) Foreign Application Priority Data

Aug. 2, 2000  (JP) .......................... 2000-234945

(51) Int. Cl.$^7$ ................................ B32B 9/00
(52) U.S. Cl. ................ 428/702; 428/1.5; 428/1.51; 428/426; 428/432; 428/688; 428/689; 428/697; 428/704
(58) Field of Search ................ 428/1.51, 432, 428/469, 702, 704, 1.5, 697

(56) References Cited

U.S. PATENT DOCUMENTS 5,458,753 A * 10/1995 Sato et al. ............ 105/286.2
5,578,501 A * 11/1996 Niwa ..................... 204/192.29

* cited by examiner

*Primary Examiner*—Deborah Jones
*Assistant Examiner*—Andrew T Piziali
(74) *Attorney, Agent, or Firm*—Arent Fox Kintner Plotkin & Kahn, PLLC

(57) ABSTRACT

An n-type dopant of at least one of elements of Group III such as Ga and the like and a p-type dopant of at least one of elements of Group V such as N and the like are doped to a ZnO crystalline layer as dopants, and the n-type dopant is more than the p-type dopant and doped into the ZnO layer in an impurity concentration of $1\times10^{18}$ cm$^{-3}$ or more. Therefore, it is possible to lower the resistivity of the ZnO layer with a degree of the transparency high and to obtain the transparent conductive film of zinc oxide having the electrical resistivity lower than ITO.

7 Claims, 2 Drawing Sheets

3:1

2:1

1.3:1

○ DONOR  ● ACCEPTOR

TRANSPARENT CONDUCTIVE FILM OF ZINC OXIDE

FIELD OF THE INVENTION

The present invention relates to a transparent conductive film used in an electrode of solar cells, liquid crystal display devices, flat panel displays, organic electroluminescence devices and the like. More specifically, the present invention relates to the transparent conductive film using zinc oxide that has the resistance to a reducing atmosphere and is a stable material against the high temperature.

BACKGROUND OF THE INVENTION

Conventionally, ITO (Indium Tin Oxide), indium oxide or the like has been used in the transparent conductive film used as the electrode of the solar cells, the liquid crystal display devices and the like. Since the electrode of these is required not only to be low in the electrical resistance but also to transmit the light without loss, the foregoing material is used.

It is known that, however, in In used in ITO or indium oxide, there are problems of supplying the material due to the exhaustion of indium resources, of instability in the reducing gas and of deterioration due to the operation in the high temperature. Alternative substances are therefore being actively studied, and zinc oxide is noted among others since it has properties superior to ITO in the respects of the resistance to the reducing gas and the stability in the high temperature.

This ZnO has the transparency and has no problem with regard to the transmittance of light, but, with regard to the conductivity, the resistivity of ZnO remains on the order of $10^{-4}$ $\Omega \cdot cm$ though conductivity thereof is yielded by doping the element of Group III such as Ga or Al, whereas the resistivity of ITO reaches the order of $10^{-5}$ $\Omega \cdot cm$. That is, the value of $7.7 \times 10^{-5}$ $\Omega \cdot cm$ was reported as the resistivity of ITO, for example, in "Highly electrically conductive indium-tin-oxide thin film epitaxially grown on yttria-stabilized zirconia (001) by pulse-laser deposition" by H. Ohta et al. (Applied Physics Letters vol. 76, pp. 2740–2742, 2000), and the value of $2.6 \times 10^{-4}$ $\Omega \cdot cm$ was reported in the resistivity of ZnO, for example, in "Transparent and conductive Ga-doped ZnO film grown by low pressure metal organic chemical vapor deposition" by Y. Li et al. (Journal of Vacuum Science Technology A15, pp. 1063–1068, 1997).

As described above, though ZnO has the advantage as the material, it has not yet become commercially practical as the transparent film for the electrode because, in ZnO, the resistivity which is the most important characteristic is large. The present inventors have deeply researched to lower the electrical resistivity of the zinc oxide, and therefore found that, in the case of ITO, the transparent film for electrode has as high mobilities as 40 to 50 $cm^{-2}V^{-1}s^{-1}$ even when the carrier concentrations are as high as $10^{21}$ $cm^{-3}$ but, in the case of ZnO, the mobility similar to the ITO can not be attained at the same carrier concentration as described above. It is thought that the reason is that a large amount of donor atoms ionized are produced and the ion scattering thereof occurs when a large amount of elements of Group III are doped to the transparent film for the electrode. On the other hand, when the equivalent of the reduction of the mobility is supplemented with the carrier concentration, the problem that the transparent film for the electrode becomes metallic due to the excess dopant and lose the transparency arises.

SUMMARY OF THE INVENTION

The present invention has been invented considering these situations, and it is an object of the present invention to provide a transparent conductive film of ZnO having the electrical resistivity lower than ITO by lowering the electrical resistivity.

The present inventors have deeply researched to lower the electrical resistivity of Zn oxide, and therefore found that it is possible to obtain the n-type ZnO layer being very low in the resistivity by doping nitrogen gradually to the ZnO while doping a definite amount of Ga and completed the present invention. That is, in the transparent conductive film of zinc oxide in accordance with the present invention, the zinc oxide layer is doped with an n-type dopant and a p-type dopant as dopants, and the n-type dopant is more than the p-type dopant and doped into the zinc oxide layer in an impurity concentration of $1 \times 10^{18}$ $cm^{-3}$ or more.

By forming this structure, combined substance of an acceptor and an donor such as Ga—N—Ga is formed in the ZnO layer, and since the combined substance has a strong covalent energy, a donor level of Ga becomes shallower due to interaction and an activation rate of Ga is increased. Consequently, even when the amount of Ga doped is less, carrier concentration may be earned, and therefore the resistivity may be lowered. That is, since the amount of Ga as a dopant to achieve the carrier concentration to be aimed may be reduced, it is possible to reduce an amount of Ga atoms ionized and to reduce the effect of ion scattering. Furthermore, since Ga and N enter into ZnO in a state of bonding, it is possible to neutralize the ionized Ga electrically. Therefore, it is possible to decrease an ion scattering factor due to the ionized Ga and to raise the mobility of the carriers.

The foregoing n-type dopant and the foregoing p-type dopant are doped into the zinc oxide layer in such a way that the ratio of the n-type dopant to the p-type dopant becomes (1.3–3):1, and therefore the both impurities are doped in a stable state.

DETAILED DESCRIPTION

Figure 1:
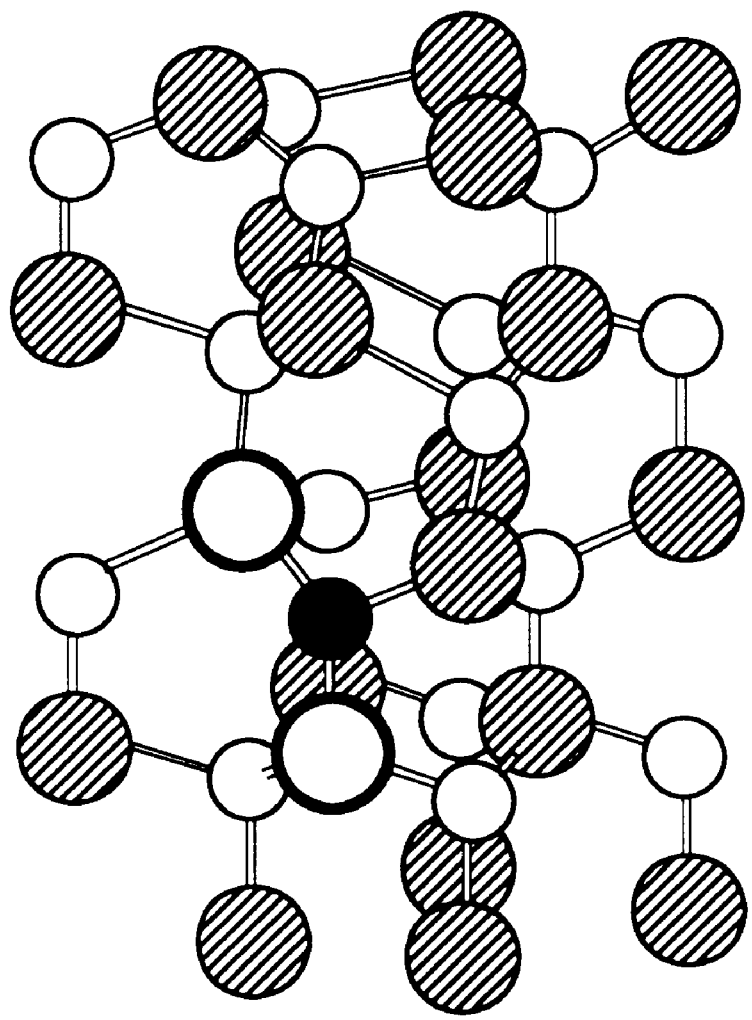
FIG. 1 is a modeled view showing a state in which two atoms of Ga and one atom of N are doped to the ZnO according to the present invention.

Then, referring to the drawings, the transparent conductive film of the present invention will be described. The transparent conductive film of the present invention is characterized in that as one example of a ZnO crystal model thereof is shown in FIG. 1, an n-type dopant of at least one of elements of Group III such as Ga and the like and a p-type dopant of at least one of elements of Group V such as N and the like are doped into a ZnO crystalline layer as dopants, and the n-type dopant is more than the p-type dopant. In this case, the transparent conductive film is characterized in that the n-type dopant is doped in an impurity concentration of $1 \times 10^{18}$ $cm^{-3}$ or more.

In the example shown in FIG. 1, there is shown a schematic diagram of an example that Ga and N are doped to the ZnO in the ratio of 2:1. That is, Ga elements enter into Zn-sites and act as the n-type dopant, and N elements enter into O-sites and act as the p-type dopant. But, since Ga elements are more than N elements as illustrated in FIG. 1, the doped ZnO shows the properties of the n-type as a whole. On the other hand, since the elements of Ga and N, respectively, replace the elements of Zn and O, they form a bond of Ga—N—Ga as illustrated in FIG. 1 and enter into the ZnO layer in a state strongly bonded. Accordingly, the donor level becomes shallower and the Ga element becomes easy to act sufficiently as the donor.

Though the model illustrated in FIG. 1 is the example in which Ga and N are doped into the ZnO in a relationship of Ga:N=2:1 wherein two Ga elements are bonded to one N element, the elements of Ga and N do not necessarily enter into the ZnO in a state of being bonded in the form of Ga—N—Ga depending on the doping conditions and may enter into separated positions. But, since the interaction as described above acts between the elements of Ga and N, the elements of Ga and N keep stable positions by a Coulomb force between them even when Ga and N do not enter into the Zn-site and O-site adjacent to each other, respectively, and enter into the separated positions, respectively, and the dopant atoms hardly move and only contribute to the movement of the carriers. Therefore, it is possible to decrease a scattering factor due to the ionization of donor elements and to raise the mobility.

Figure 2A:
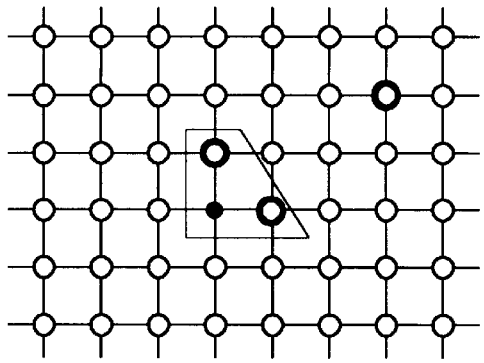
FIGS. 2(a) to 2(c) are views, modeled by four coordination compound, showing the feasibility of arrangement of donors and acceptors to be doped into ZnO.
Figure 2B:
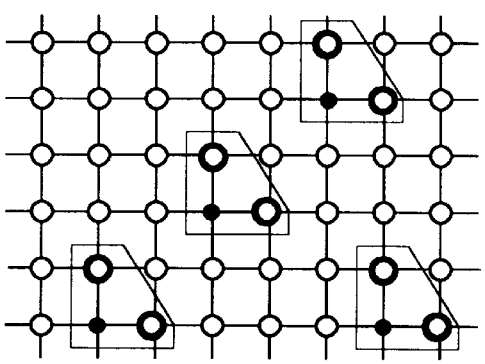
Figure 2C:
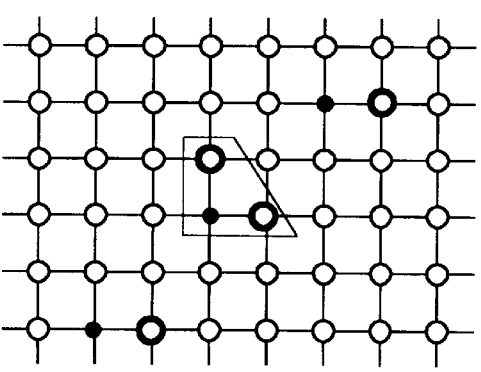

With regard to this doped state, it is preferred that the donor and the acceptor enter in the ratio of the former to the latter of 3:1 to 1.3:1 as shown in FIGS. 2($a$) to 2($c$) by way of the examples of the two dimensional model for representing the four coordination compound (the compound of Groups II and VI becomes the four coordination compound), in which donors can generally enter. That is, FIG. 2($a$) is the example in which one set is formed by combining a pair of two donors (e.g. Ga) and one acceptor (e.g. N) and a single donor (Ga:N=3:1), and the sets exist over all. Since when the amount of the donors increase over this, electrostatic repulsion between the donors becomes large, this rate of donors is considered to be substantially an upper limit in solubility.

Further, FIG. 2($b$) is the example in which a plurality of the foregoing pair of two donors and one acceptor exist over the whole ZnO layer (Ga:N=2:1) and the dopants are most stable in terms of energy. Further, FIG. 2($c$) is the example in which one set is formed by combining the foregoing pair of two donors and one acceptor and two pairs of one donor and one acceptor (Ga:N=1.3:1), and this rate of donors is lowest limit for acting as a donor. By the way, circles denote the elements composing the compound, bold circles the donors (Ga) and bullets the acceptors (N), respectively, in FIGS. 2($a$) to 2($c$).

The n-type dopant is not limited to the above-mentioned Ga, another elements of Group III such as B, Al. In and Tl or Group VII B such as Cl, Br and I may also be used as the n-type dopant. Incidentally, when the elements of Group VII B are used, these elements enter into the O-sites of ZnO and were not bonded directly to the p-type dopants, but both dopants are bonded to each other by a Coulomb force between the both dopants as described above. Also, as the p-type dopant, another element of Group VB such as P, As and Sb or elements Group IA such as Li, Na, K and Rb other than the above-mentioned N may also be used.

To dope both of Ga and N described above, diehylzinc ($Zn(C_2H_5)_2$) being reactive gas of Zn, tetrahydrofuran ($C_4H_8O$) as O source, trimethyl gallium (TMG) as the n-type dopant and plasma nitrogen as the p-type dopant are introduced into an apparatus of MOCVD with hydrogen ($H_2$) of carrier gas and reacted to deposit the layer when the ZnO layer is grown, for example, by metalorganic chemical vapor deposition (MOCVD). In this operation, the ZnO layer is grown while supplying Ga more than plasma N in such a way that Ga of the n-type dopant becomes about twice plasma nitrogen of the p-type dopant. However, when the amount of Ga is too much, it is impossible to raise the mobility of the carrier sufficiently since a scattering factor due to the ionization of Ga is increased with Ga easy to move as well as the conventional case that only the n-type dopant is added, and the possibility that Ga enters into the position between lattices increases and the Ga having entered into the position between lattices forms a deep donor level, and therefore the action as the n-type dopant is not performed sufficiently. For this reason, as described above, the film is formed while supplying the dopant gas in such a way that the ratio of Ga to N becomes about (1.3–3):1

Further, though the amount of these dopant for doping (impurity concentration) is required to be the amount for doping in such a way that the carrier concentration of $8\times10^{17}$ $cm^{-3}$ or more is attained, it is possible to attain high carrier concentration even when the amount of the dopant is less than in accordance with the present invention, and if the n-type dopant is doped to the film more than the order of at least $1\times10^{18}$ $cm^{-3}$, it is possible to attain the above-mentioned carrier concentration and the low resistivity superior to ITO. As a result of forming the film, having thickness of about 0.7 $\mu$m, of the ZnO layer to which Ga is doped in the concentration of $3.5\times10^{20}$ $cm^{-3}$ and N in the concentration of $1.5\times10^{20}$ $cm^{-3}$ by the above-mentioned way, the transparent conductive film of which the resistivity was as low as $1.1\times10^{-4}$ $\Omega\cdot cm$ as measurement by four prove analysis measuring hole and the degree of transparency was similar to ITO (more than 85% of ITO) could be obtained.

Further, when the transparent conductive film is grown by MBE (molecular beam epitaxy), the transparent conductive film can be obtained by irradiating Ga of the n-type dopant and nitrogen of the p-type dopant while irradiating Zn and plasma oxygen by a vacuum apparatus in such a way that Ga becomes about twice nitrogen as described above to form a film.

As described above, the transparent conductive film of zinc oxide has not yet become commercially practical since, in the zinc oxide layer, the resistivity could not be sufficiently reduced even though the carrier concentration was increased and there was a problem that the transparency was decreased when the amount of the dopant was increased too much to raise the carrier concentration, but, in accordance with the present invention, since an n-type layer is formed by doping a p-type dopant together with an n-type dopant, the interaction by a Coulomb force between the both dopants is large, and the donor level becomes shallower and the carriers are easy to move, and therefore the carrier concentration may be considerably enhanced.

In addition, it is possible to neutralize the ionized Ga electrically through bonding Ga and N and to decrease the scattering factor due to ionization of Ga of donor element. Consequently, even when the amount of the dopant was not increased so much, it is possible to raise the carrier concentration and the transparency is not decreased. Therefore, the zinc oxide layer with significantly low electrical resistance may be used as the electrode of the displays such as the liquid crystal displays and the like and the electrode of the solar cells.

In accordance with the present invention, while using the zinc oxide layer, the transparent conductive film having the considerably high degree of transparency and the low electrical resistivity maybe obtained. Therefore, the zinc oxide layer may be used in the transparent electrode of the liquid crystal display, the flat panel display, the organic electroluminescence device or the solar cell in place of ITO having problems of exhaustion of In resources and an operational deterioration in the high temperature.

Although preferred examples have been described in some detail it is to be understood that certain changes can be made by those skilled in the art without departing from the spirit and scope of the invention as defined by the appended claims.

What is claimed is:

1. A transparent conductive film of zinc oxide, comprising:

a zinc oxide layer, and dopants doped into said zinc oxide layer, wherein said dopants have an n-type dopant and a p-type dopant, and said n-type dopant is more than said p-type dopant and doped in an impurity concentration of $1 \times 10^{18}$ cm$^{-3}$ or more, wherein said n-type dopant is at least one kind of element selected from the group consisting of elements from Group IIIB or VIIB and said p-type dopant is at least one kind of element selected from the group consisting of elements of Group VB or IA.

2. The transparent conductive film of claim 1, wherein said n-type dopant and said p-type dopant are doped into said zinc oxide layer in such a way that the ratio of said n-type dopant to said p-type dopant becomes (1.3–3):1.

3. The transparent conductive film of claim 1, wherein said n-type dopant and said p-type dopant, respectively, are doped into said zinc oxide layer in a concentration of $8 \times 10^{18}$ cm$^{-3}$ or more.

4. The transparent conductive film of claim 1, wherein a resistivity of said zinc oxide layer doped with said dopants is $1.1 \times 10^{-4}$ Ω·cm or less.

5. The transparent conductive film of claim 1, wherein said n-type dopant is gallium (Ga), and said p-type dopant is nitrogen (N).

6. A transparent conductive film of zinc oxide, comprising:

a zinc oxide layer, and dopants doped into said zinc oxide layer, wherein said dopants have an n-type dopant and a p-type dopant, and said n-type dopant is more than said p-type dopant and doped in an impurity concentration of $1 \times 10^{18}$ cm$^{-3}$ or more, wherein said n-type dopant is at least one kind of element selected from the group consisting of elements of Group IIIB, and said p-type dopant is at least one kind of element selected from the group consisting of elements of Group VB.

7. A transparent conductive film of zinc oxide, comprising:

a zinc oxide layer, and dopants doped into said zinc oxide layer, wherein said dopants have an n-type dopant and a p-type dopant, and said n-type dopant is more than said p-type dopant and doped in an impurity concentration of $1 \times 10^{18}$ cm$^{-3}$ or more, wherein said n-type dopant is at least one kind of element selected from the group consisting of elements of Group VIIB, and said p-type dopant is at least one kind of element selected from the group consisting of elements of Group IA.

* * * * *